United States Patent [19]

Herbst et al.

[11] Patent Number: 5,034,746
[45] Date of Patent: Jul. 23, 1991

[54] ANALOG-TO-DIGITAL CONVERTER FOR COMPUTER DISK FILE SERVO POSITION ERROR SIGNAL

[75] Inventors: Gary A. Herbst, San Jose; David M. Jones, Gilroy, both of Calif.

[73] Assignee: International Business Machines Corporation, Armonk, N.Y.

[21] Appl. No.: 247,469

[22] Filed: Sep. 21, 1988

[51] Int. Cl.$^5$ ............................................. H03M 1/36
[52] U.S. Cl. .................................... 341/172; 341/158; 341/159
[58] Field of Search ................. 341/94, 132, 133, 158, 341/159, 172, 134, 139

[56] References Cited

U.S. PATENT DOCUMENTS

| | | | |
|---|---|---|---|
| 3,516,085 | 6/1970 | Dano | 340/347 |
| 3,546,548 | 2/1972 | Van Doran | 340/347 |
| 3,818,502 | 6/1974 | Chien et al. | 360/77 |
| 3,982,240 | 9/1976 | Waehner | 340/347 |
| 4,042,921 | 8/1977 | Smith | 340/347 |
| 4,056,820 | 11/1977 | Hofer | 340/347 |
| 4,059,800 | 11/1977 | Jones, Jr. | 325/38 B |
| 4,083,044 | 4/1978 | Marshall, III et al. | 340/347 |
| 4,107,669 | 8/1978 | Tewksbury | 340/347 |
| 4,110,745 | 8/1978 | Ninomiya | 340/347 |
| 4,112,428 | 9/1978 | Dorsman | 341/158 |
| 4,196,419 | 4/1980 | Brown | 340/347 |
| 4,251,802 | 2/1981 | Horna | 340/347 AD |
| 4,323,886 | 4/1982 | Duley | 341/133 |
| 4,353,060 | 10/1982 | Endoh et al. | 340/347 AD |
| 4,380,005 | 4/1983 | Debord et al. | 340/347 AD |
| 4,400,747 | 8/1983 | Silverling | 360/77 |
| 4,485,372 | 11/1984 | Holloway | 340/347 |
| 4,544,917 | 10/1985 | Lenhoff, Jr. | 340/347 |
| 4,544,918 | 10/1985 | De Haan | 340/347 |
| 4,550,309 | 10/1985 | Hiller et al. | 340/347 AD |
| 4,551,776 | 11/1985 | Roalson | 360/77 |
| 4,608,555 | 8/1986 | Hoeft | 341/159 |
| 4,679,103 | 7/1987 | Workman | 360/77 |
| 4,779,074 | 10/1988 | Whitford et al. | 341/172 |

OTHER PUBLICATIONS

W. A. Herrington et al., "Quad-Burst PES System for Disk File Servo", IBM Technical Disclosure Bulletin, vol. 21, No. 2, Jul. 1978, pp. 804–805.

R. K. Oswald, "Design of a Disk File Head-Positioning Servo", IBM J. Res. Dev., Nov. 1974, pp. 506–512.

Primary Examiner—William M. Shoop, Jr.
Assistant Examiner—Gary J. Romano
Attorney, Agent, or Firm—David J. Arthur; Thomas R. Berthold

[57] ABSTRACT

A method of digitizing an imput analog current signal such as a demodulated servo position error signal in a disk file includes charging a capacitor with the input demodulated signal, and comparing the resulting capacitor voltage with a plurality of thresholds to produce a comparator output signal for each threshold exceeded by the capacitor voltage. The comparator output signals are sampled, and each sampling period a current corresponding to the thresholds exceeded is generated. The generated current is used to draw off charge from the capacitor until an equilibrium voltage is reached. By knowing the current generated to remove from the capacitor the voltage placed thereon by the input current signal, then the total charge applied to the capacitor can be determined. Further digital processing of the input signal value may be done without the use of a complicated digital to analog converter.

13 Claims, 3 Drawing Sheets

FIG. 3A — H.L. SERVO

FIG. 3B — Q DEMODULATOR OUTPUT CURRENT

- CMP 5 REF
- CMP 4 REF
- A BURST
- B BURST
- CMP 3 REF
- CMP 2 REF — EQUILIBRIUM
- CMP 1 REF
- DIGITALIZATION COMPLETED

ANALOG-TO-DIGITAL CONVERTER FOR COMPUTER DISK FILE SERVO POSITION ERROR SIGNAL

FIELD OF THE INVENTION

The present invention relates to high speed analog-to-digital converters, and particularly to the analog-to-digital converters used in converting the current based position error signal of the servo actuator of a computer disk file.

BACKGROUND OF THE INVENTION

Disk files are information storage devices that use a rotatable disk with concentric data tracks containing the information, a head for reading data from or writing data onto the various tracks, and an actuator connected by a support arm assembly to the head for moving the head to the desired track and maintaining it over the track centerline during read or write operations. The movement of the head to a desired track is referred to as track accessing or "seeking", while the maintaining of the head over the centerline of the desired track during a read or write operation is referred to as track "following".

The actuator is typically a "voice coil motor" (VCM), which comprises a coil movable through the magnetic field of a permanent magnetic stator. The application of current to the VCM causes the coil, and thus the attached head, to move radially with respect to the disk. The acceleration of the coil is proportional to the applied current, so that ideally there is no current to the coil if the head is perfectly stationary over a desired track.

In disk files having a relatively high density of data tracks on the disk, it is necessary to incorporate a servo control system to maintain the head precisely over the centerline of the desired track during read or write operations. This is accomplished by using prerecorded servo information either on a dedicated servo disk or on sectors angularly spaced and interspersed among the data on a data disk. The servo information sensed by the read/write head (or the dedicated servo head if a dedicated servo disk is used) is demodulated to generate a position error signal (PES), which is an indication of the position error of the head away from the nearest track centerline. One type of conventional servo pattern for use with either a sector servo disk or a dedicated servo disk is the quadrature pattern described by Herrington and Mueller in IBM TECHNICAL DISCLOSURE BULLETIN, Vol. 21, No. 2 (July 1978) pp. 804–805. In the quadrature pattern there are four unique track types which repeat so as to form radially repetitive four-track bands of servo information.

During track seeking, when the head is moving across the tracks, the PES is used to generate track crossing pulses. This track crossing information, together with the PES and a signal representing the desired or target track, is used to generate a total error signal. The total error signal is equal to the sum of the PES plus the difference between the position of the target track and the position of the actual track over which the head is located. The total error signal is then used in the servo feedback loop to compute the desired velocity of the head, via a reference velocity trajectory generator, to assure that the head arrives at the target track according to the optimum velocity trajectory to effect a move to the target track in minimum time. The computed velocity is then compared with the estimated velocity from an electronic tachometer to generate a velocity error signal to a power amplifier which in turn applies a control current to the VCM. An electronic tachometer for generating a velocity estimate from inputs of VCM control current and quadrature PES is described in U.S. Pat. No. 4,246,536 to Bradley, et al., which is assigned to the same assignee as this application.

During track following, when the head is located within the boundaries of the desired track, the PES alone is used in the servo feedback loop to generate a control signal to the VCM to move the head back to the track centerline.

A description of operation of a general disk file servo control system during track seeking and track following is given by R. K. Oswald in "Design of a Disk File Head-Positioning Servo", IBM JOURNAL OF RESEARCH AND DEVELOPMENT, November 1974, pp. 506–512.

In such conventional disk files, the use of track crossing pulses to determine the total error signal during a track seek requires additional costly and complex analog circuitry in the demodulator to generate the track crossing pulses from the PES. More importantly, in the case of disk files which use sector servo data, it is not possible to accurately count track crossing pulses directly from the PES since the head will typically have crossed numerous tracks between PES samples.

In the past, many computer hard disk files have been equipped with analog servo systems for controlling the movement of the head and arm radially over the disk surface. More recent products however incorporate a digital servo mechanism.

A digital servo control system is described in U.S. Pat. No. 4,679,103 to Workman. As described in that patent, the digital servo control system receives as input, at discrete sample times, the position error signal and a digital value representation of the voice coil motor current.

Included in the digital servo control system is a digital processor that controls the overall servo performance. Typically, position error signal (PES) circuits in the head and arm signal channel are analog, and represent the position of the head on the disk. For digital processing, the analog position error signal is converted to a digital signal using a conventional analog-to-digital converter (ADC). The digital PES signal may then be read by the digital processor.

A simplified block diagram of a digital servo control system is shown in FIG. 1. Such a digital servo control system is described in more detail in U.S. Pat. No. 4,679,103 to Michael C. Workman, entitled "Digital Servo Control System for a Data Recording Disk File," which is assigned to the same assignee as this application.

A pair of disks 10, 12 are supported on a spindle 14 of the disk file drive motor 16. Each of the disks 10, 12 has two surfaces 20, 22 and 24, 26, respectively. For purposes of this description, the surface 20 on the disk 10 and the surfaces 24, 26 on the disk 12 are data recording surfaces. The surface 22 on the disk 10 is a dedicated servo surface and contains only prerecorded servo information. The servo information is recorded in concentric tracks and is typically written in such a manner that the intersections of adjacent servo tracks on the servo surface 22 are radially aligned with the centerlines of the data tracks on the surfaces 20, 24, and 26. The servo information on the surface 20 may be the quadrature pattern, as described in the previously cited reference by Mueller, et al.

The specific tracks on the data disks and the servo disk are accessed by heads 30, 32, 34, 36, each of which is associated with a respective disk surface and supported by an associated arm assembly. The heads 30, 32, 34, 36 are attached to a common accessing means or actuator, such as a VCM 40. Thus the heads 30, 32, 34, 36 are all maintained in a fixed relationship with one another relative to the radial position on their respective disk surfaces.

The output of the dedicated servo head 32 is supplied to an amplifier 42 and then to a demodulator 44. Demodulator 44 processes the servo information signal from the disk surface 22 and demodulates it to generate an analog PES. The PES from the demodulator 44 is an indication of the position of the servo head 32 away from the nearest servo track centerline, and thus the position of the data heads 30, 34, 36 away from the centerlines of the nearest data tracks on the respective disk surfaces 20, 24, 26.

A microprocessor 50 is connected to a random access memory (RAM) 52 and a programmable read only memory (PROM) 53 via a data bus 54. The disk file control unit 56 is also connected to data bus 54. A control unit 56 provides numerous commands to the microprocessor 50, including a signal, $t_d$, representing the target track, and a signal, RZ, representing a "re-zero" to initialize the servo control system. Not shown in FIG. 1 are address and control lines for the microprocessor 50. The analog portion of the servo control system is shown essentially to the right of the data bus 54 in FIG. 2.

The signal read by the servo head 32 is input to the amplifier 42 and then the demodulator 44. While the control circuit is operable with any of numerous types of servo patterns and servo signal demodulation techniques, the servo control system will be explained with reference to a quadrature servo pattern.

The quadrature pattern on the servo surface 22 is demodulated by the demodulator 44 in the following manner. First, the demodulator 44 receives the quadrature servo signal from the amplifier 42 and generates two separate analog waveforms, which are designated primary (PESP) and quadrature (PESQ). The analog PESP and PESQ signals from the demodulator 44 are sent to analog-to-digital (A/D) converters 58, 59, respectively, which are constructed according to the present invention. The discrete values of PESP and PESQ at any sample time are designated PESP(n) and PESQ(n), where n represents a time index for each digital sample. The digital signal samples PESP(n) and PESQ(n) are then used by the microprocessor 50 to determine on which of the four tracks in one of the four-track bands of the quadrature pattern the servo head 32 is located. Once that has been determined, then the selection of the correct signal, i.e. either PESP(n) or PESQ(n), is made to determine PES(n).

The determination of the track type, and PES(n), and further operation of a digital servo control system is described in the previously-cited Workman patent.

Referring again to FIG. 1, the demodulator 44 also provides directly to the data bus 54 a one-bit digital signal, GBOD, to indicate that servo head 32 is located over the "guard band outside diameter", i.e. the radially outermost head position in the disk file. This signal is generated from a special code recorded on the radially outermost track on servo surface 22.

An integrating power amplifier (IPA) 64 provides the analog control current, i(t), to the VCM 40 and as feedback to an A/D converter 60. The A/D converter 60 provides to the data bus 54 a digital current sample, i(n), corresponding to the sample of analog current, i(t).

Thus, as shown in FIG. 1, the data inputs to the microprocessor 50 of the digital servo control system for purposes of this explanation are control unit commands for target track $t_d$ and re-zero RZ, head position relative to nearest track centerline PES(n), which is determined from PESP(n) and PESQ(n), VCM control current i(n), and GBOD.

A digital control signal, u(n), is output by the microprocessor 50 to a digital-to-analog converter (DAC) 62. As shown in FIG. 1, A/D converters 58, 59, 60 are driven by the same clock input so that the digital sampling of PESP, PESQ and i, all occur simultaneously. The output of the control signal u(n) computed from the digital sample of PESP(n) and i(n) occurs after a fixed calculation delay time and before the input of the next digital sample of PESP(n+1), PESQ(n+1) and i(n+1). The DAC 62 provides the analog control signal, u(t), to the IPA 64.

The microprocessor 50 also sends a special inhibit signal to the IPA 64. The IPA 64 is inhibited when the servo control system is first turned on to prevent any initial signal conditions from causing undesired movement of the VCM 40.

Several techniques are available to convert the analog signal into a digital form in the A/D converters 58, 59, but most of these techniques require large input voltage swings, and long periods of time to produce an accurate digital signal.

SUMMARY OF THE INVENTION

The present invention is a method of and apparatus for digitizing an input analog servo position error signal. The method includes charging a capacitor with the input analog current signal, then comparing the voltage on the capacitor with each of a plurality of voltage thresholds to produce a comparator output signal for each threshold exceeded by the capacitor voltage. The comparator output signals are sampled at a predetermined sampling rate. Then a current is generated each sampling period corresponding to the thresholds exceeded. The current is applied to the capacitor to draw off a certain amount of its charge and reduce its voltage. The voltage comparison, sampling, current generation, and current application steps are repeated until the capacitor reaches an equilibrium voltage, as detected by the comparators. The sampled comparator output signals are decoded, and combined over a predetermined time to generate a digital position error signal.

BRIEF DESCRIPTION OF THE DRAWINGS

FIG. 3A illustrates the amplified analog signal received from the servo head.

FIG. 3B shows the Q demodulator output current signal.

DETAILED DESCRIPTION OF THE PREFERRED EMBODIMENT

Figure 1:
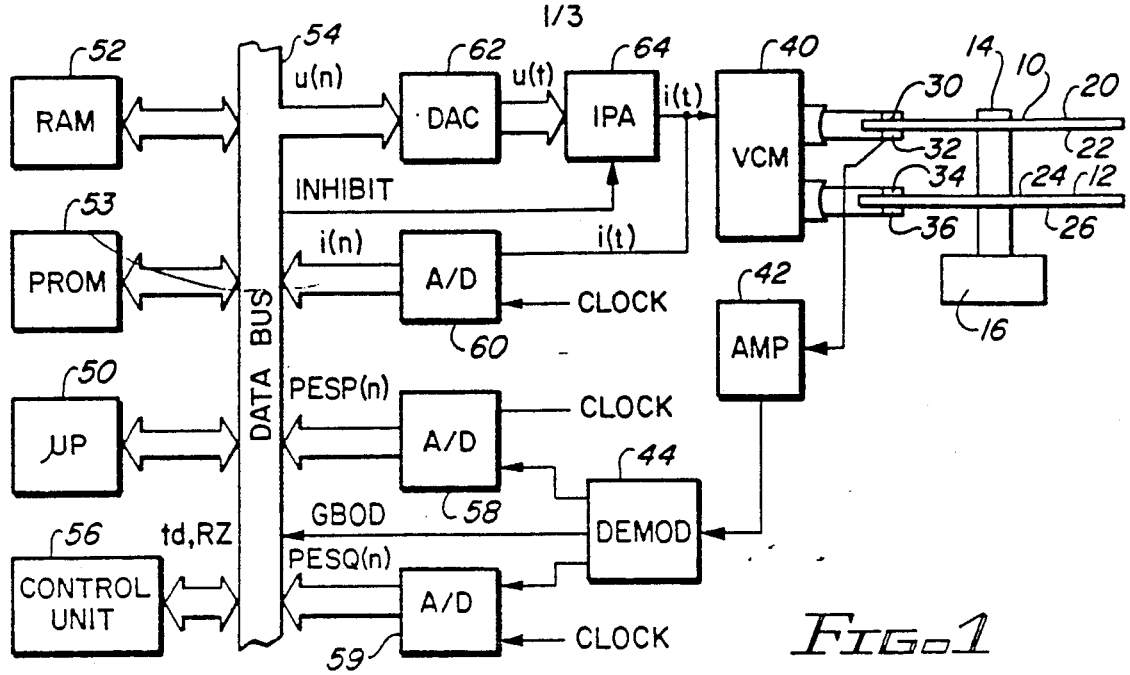
FIG. 1 is a block diagram of a digital servo control system for which the signal digitizer of the invention is applicable.

The digitizer of the invention may be used as the analog to digital converters 58, 59 in the digital servo control circuit of FIG. 1. The preferred embodiment of the digitizer of the invention processes current-based signals. Therefore, the demodulator 44 preferably outputs a current signal.

Figure 2:
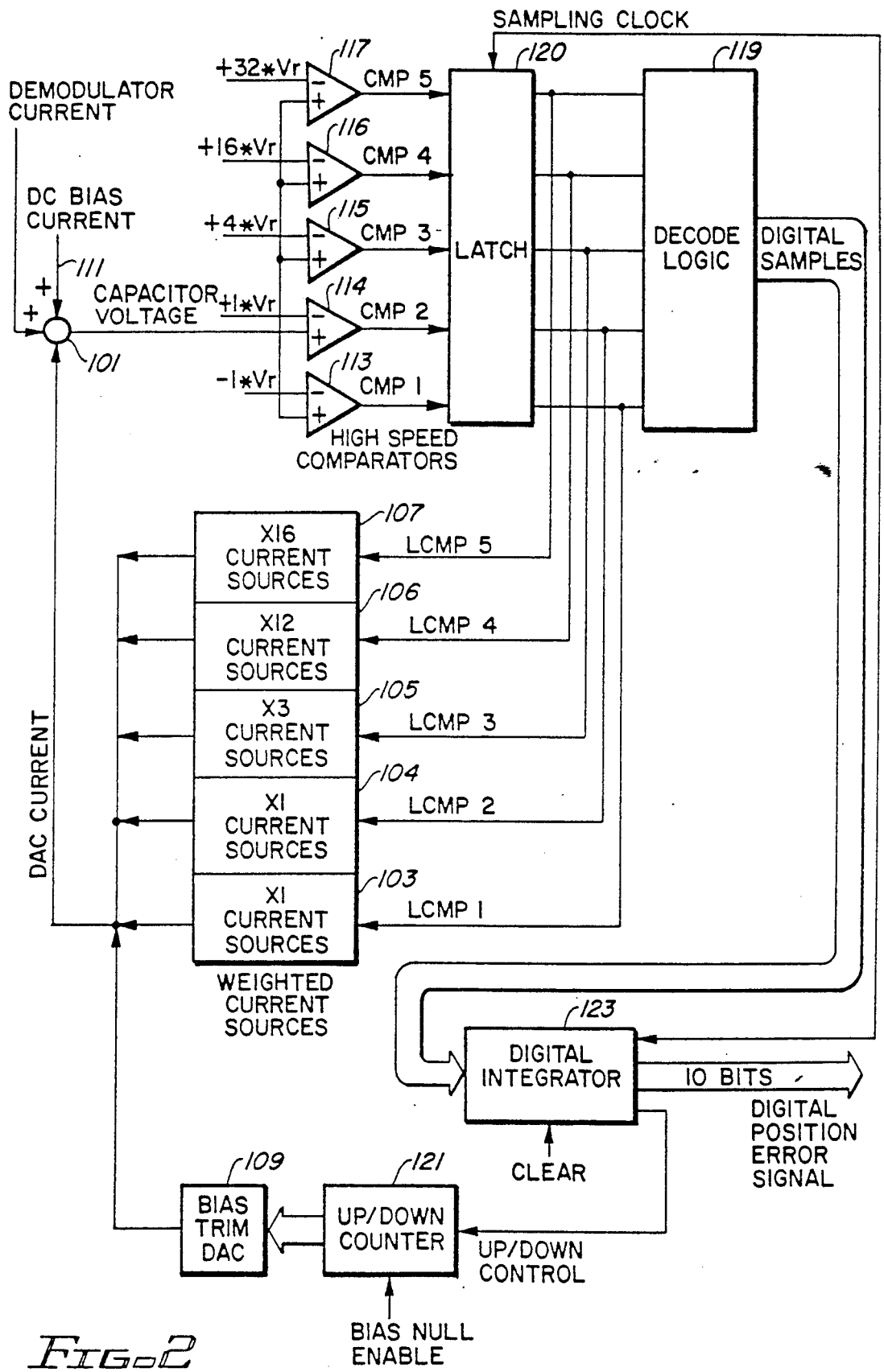
FIG. 2 is a block diagram of a preferred embodiment of the digitization circuit constructed according to the invention.

A preferred embodiment of the digitizer of the invention is shown in the block diagram of FIG. 2. This system performs position error signal digitization, and also nulls offsets in the digitizer or demodulator system. The digitizer receives the analog output current signal from the demodulator 44 and outputs a digital position error signal (PES). The system quantizes the charge as it is generated, and allows for digital integration of the position error signal value, rather than requiring analog integration. This digital integration allows for precision position error signal digitization to be completed at the end of the position information substantially faster than with traditional analog-to-digital converters. Additionally, as the system operates on currents, rather than voltages, the system requires lower voltage swings, and the special voltage supplies that are often needed for analog-to-digital conversion processes are eliminated.

The analog demodulator current is applied from an input terminal to a summing node 101. This summing node may be a charge storage device such as a capacitor. Additional inputs to the capacitor summing node are the current from weighted current sources 103-107, current from a bias trim circuit 109, and an inherent DC bias current 111. These additional currents will be discussed further below.

The voltage on the capacitor 101 is sensed by a plurality of comparators 113-117, which are referenced to different voltage levels. For speed and simplicity, each comparator simply provides a comparator output signal when the input voltage exceeds that comparator's reference voltage. In the illustrated embodiment, five comparators are used. More comparators provide greater accuracy, but at increased hardware complexity.

The reference voltage for the first comparator 113 in the illustrated embodiment is near ground potential and represents digital value of −1. The reference voltage for the second comparator 114 may be approximately 50 mv above the reference for the first comparator and represents a digital 0. The equilibrium point for the system may be the mid-point between these two reference voltages, e.g., approximately 25 mv above the reference voltage for the first comparator, and 25 mv below the reference voltage for the second comparator. When the capacitor voltage is at the equilibrium value, the outputs of the comparators are decoded as a 0 by the decode logic 119 connected to the comparator output terminals.

The reference voltages for the other comparators 115-117 are preferably binary multiples of the equilibrium voltage for ease of construction. In the preferred embodiment, the reference voltage for the third comparator 115 is preferably four times the equilibrium point, or 100 mv. The reference voltage for the fourth comparator 116 is preferably sixteen times the equilibrium voltage, or 400 mv. Finally, the reference voltage for the fifth comparator 117 is approximately 32 times the equilibrium voltage, or 800 mv. Clearly, such reference voltages may change depending on the application and requirements of the digital converter.

Each comparator 113-117 outputs a comparator output signal (CMP1, . . . , CMP5) when the capacitor voltage exceeds the reference voltage for that comparator. The latch 120 latches the comparator output signals at a high sampling rate to produce latched signals LCMP1-LCMP5. The sampling rate also affects the accuracy of the system. A higher sampling frequency provides more accurate digitization, but requires more sophisticated hardware. A sampling clock frequency of eight (8) times the fundamental frequency of the received position error signal has been found to provide appropriate accuracy. At that sampling rate, with five threshold comparators, a digital position error signal of ten (10) bits accuracy can be generated.

Decode logic 119 decodes the sampled comparator output signals CMP1-CMP5 to produce digital samples. Table 1 illustrates how the comparator output signals are decoded by the decode logic. This decoding corresponds with the scaling of the reference voltages of the comparators.

TABLE 1

| CMP1 | CMP2 | CMP3 | CMP4 | CMP5 | BINARY OUTPUT |
|---|---|---|---|---|---|
| 0 | 0 | 0 | 0 | 0 | −1 |
| 1 | 0 | 0 | 0 | 0 | 0 |
| 1 | 1 | 0 | 0 | 0 | 1 |
| 1 | 1 | 1 | 0 | 0 | 4 |
| 1 | 1 | 1 | 1 | 0 | 16 |
| 1 | 1 | 1 | 1 | 1 | 32 |

Before digitization of the PES current from the demodulator is undertaken, the equilibrium voltage of the capacitor 101 should be initialized. This is done with the bias trim digital-to-analog converter (DAC) 109. During initialization of the channel, the output of the demodulator 44 is squelched, so that it does not provide any current to the capacitor summing node 101. The bias trim digital-to-analog converter (DAC) 109 is then adjusted to sink enough current from the capacitor summing node 101 to cancel any of the offset currents due to the DC bias current 111, the input current of the comparators 113-117, and the offset currents due to the demodulator 44 and weighted current sources 103-107. The bias trim DAC 109 is controlled by an up/down counter 121. The counter counts up or down depending on whether the binary value determined by the comparator decode logic 119 is positive or negative. If the decoded value is positive, then the counter counts up. Thus, the DAC sinks more current from the capacitor node, forcing the charge or voltage on it to decrease until eventually it reaches an equilibrium point, at which only the first comparator 113 produces a comparator output signal CMP1. When the equilibrium point is reached, the counter 121 is disabled so it retains the count that created the "0" or equilibrium state. The use of this bias trim counter 121 and DAC 109 allows offsets in the converter system to be easily eliminated.

Once the channel is initialized and the bias trim DAC 109 is disabled, then any change in the capacitor voltage from the equilibrium point is necessarily caused by the demodulator current, which is always supplied to the capacitor summing node 101, and the weighted current sources 103–107, which remove, or sink, current from the capacitor summing node. Therefore, the capacitor voltage is proportional to the combination of or difference between these two currents. If the demodulator current is greater than the current from the weighted current sources, then the charge on the capacitor is increased, and the capacitor voltage increases.

The weighted current sources 103–107 are controlled directly by the latched comparator output signals LCMP1–LCMP5, which are generated by the comparators 113–117 that sense the capacitor voltage and sampled by the latch 20. Each current source is turned on by each sampling period that the corresponding comparator output signal is produced. The weighted current sources are scaled so that together they produce current in the same relative increments as the reference voltages for the comparators.

When the first threshold voltage is exceeded and the first comparator 113 produces a comparator output signal, the first current source 103 is turned on to draw a corresponding charge off the capacitor 101. As described above, the system has been set so the equilibrium capacitor voltage remains between the threshold of the first comparator 113 and the threshold of the second comparator 114. Therefore, the first current source 103 is always on.

When the capacitor voltage exceeds the second voltage threshold Vr (the reference voltage), the second comparator output signal CMP2 is produced by the second comparator 114. At the next sampling time, the comparator output signal CMP2 is sampled to produce the second latched comparator output signal LCMP2. This causes the second current source 104 to be turned on. The current from the second current source is applied to the capacitor 101 as a negative to draw off charge from the capacitor. This current that counters the charge and brings the capacitor voltage to the second threshold voltage Vr may be referred to as a reference current.

When the capacitor voltage exceeds the third voltage threshold 4*Vr, the third comparator 115 produces its comparator output signal CMP3. The signal CMP3 is latched, and then the third current source 105 is turned on. The first and second current sources remain on. Together the second and third current sources produce a current four times the basic current of the second current source 104 (the reference current), as the voltage threshold 4*Vr of the third comparator is four times the voltage of the second comparator (the reference voltage Vr). The current sources then apply current as a negative to the capacitor 101 and draw charge from the capacitor.

The fourth current source 106 produces a current twelve times the reference current of the second current source, so that the fourth, second, and third current sources together produce a current sixteen times the reference current, as the threshold voltage of the fourth comparator 116 is sixteen times the reference voltage Vr. Similarly, the fifth current source 107 produces a current sixteen times the reference current so that the combined current of the second, third, fourth, and fifth current sources is thirty-two times the reference current, corresponding to the ratio of the threshold of the fifth voltage comparator 117 and the reference voltage Vr.

Figure 3C:
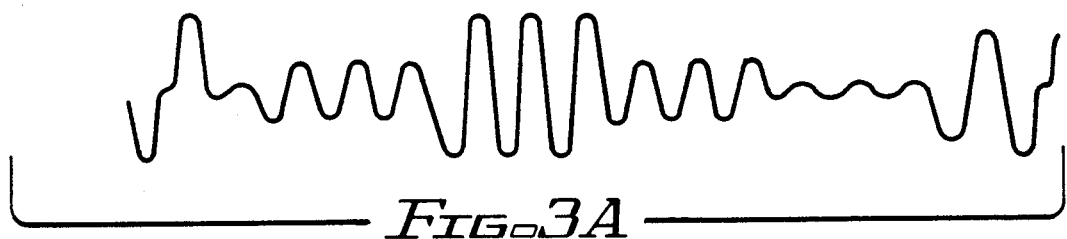
FIG. 3C illustrates the Q capacitor voltage of the capacitor used in the digitization circuit of the invention.
Figure 3C:
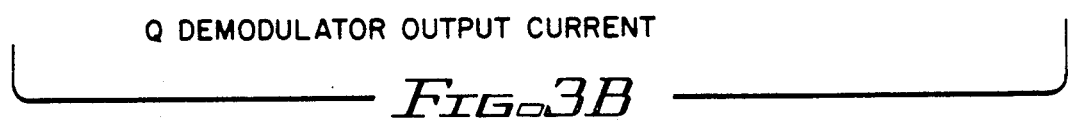

A high level servo signal for the quadrature burst (Quad-Burst) servo signal format is shown in FIG. 3A. The Q demodulator output current portion PESQ, as output from the demodulator 44 (FIG. 1) is shown in FIG. 3B. The capacitor voltage for the capacitor summing node 101 of the Q portion of the circuit is shown in FIG. 3C. The signals shown are for the Q channel when the A and B bursts are equal, representing a track center.

As seen in FIG. 3C, the capacitor voltage is initially at the equilibrium voltage. The Q demodulator output current for the A burst is input to the digitizer of the invention and raises the capacitor voltage up to, in this case, a level above the reference voltage CMP5 REF for the fifth comparator 117. Thus, all five current sources 103–107 are activated, bringing the capacitor voltage back down. When the capacitor voltage reaches the fourth reference voltage CMP4 REF, the fifth current source 107 is turned off, but the first through fourth current sources 103–106 remain on, further reducing the capacitor voltage, and so forth, until the capacitor voltage drops to a level between the reference voltages of the first and second comparators, representing equilibrium voltage. The cycle is then repeated for the B burst, following which digitization of the A and B bursts is completed.

The voltage on the capacitor is not discharged back to the equilibrium voltage immediately, but lags behind the time that the demodulator current drops to 0. The size of the summing charge storage capacitor 101 and the magnitude of the currents generated by the weighted current sources 103–107 are designed so that the equilibrium voltage is reached before the next burst of current from the demodulator 44 is injected into the capacitor node 101. When the equilibrium voltage is reached, the total amount of current supplied by the weighted current sources must be equal to the total amount of current supplied by the demodulated burst. Therefore, by keeping track of which current sources are enabled in each sampling period, the total demodulator current that was supplied to the capacitor during each burst can be calculated.

The current sources 103–107 are controlled by the sampled or latched comparator output signals. Therefore, the higher the sampling rate, the more accurately the current applied to the capacitor 101 by the current sources 103–107 reflects the current output to the capacitor 101 by the demodulator 44.

Figure 4:
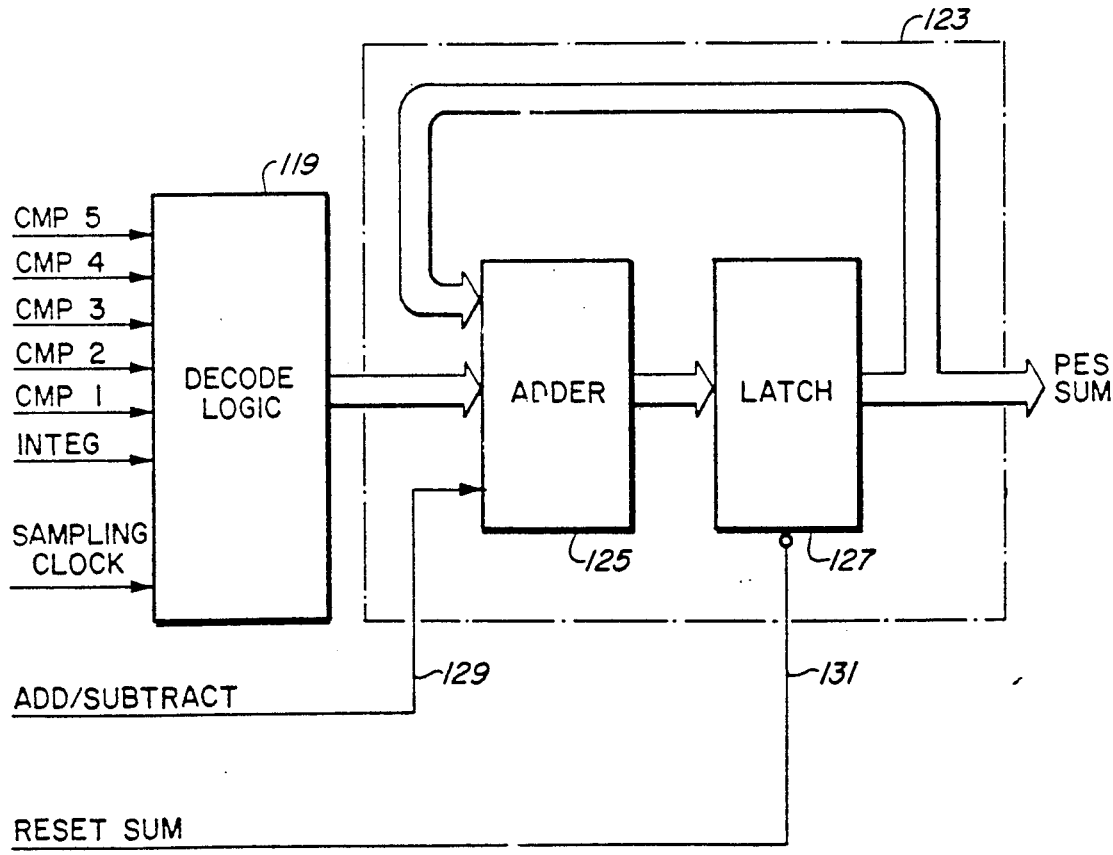
FIG. 4 is a block diagram of a preferred embodiment of the digital integrator useful with the digitizer of the invention.

The comparator output signals are decoded into binary numbers by the decode logic 119. The latched decoded values, which represent the amount of current supplied by the weighted current sources 103–107 then are input to a digital integrator 123, such as that shown in FIG. 4. The adder 125 sums the input value with the previous sum to form a new sum. The sum is held in a latch 127 to be added to the next binary input. As charge is the integral of current, the output of the digital integrator represents the total amount of charge that was supplied to the capacitor 101 by the demodulator circuit 44. Once the total charge is digitized, it is proportional to the magnitude of that particular burst.

For a Quad-Burst pattern, there are four signal bursts, which are designated A, B, C, and D. Each PES signal (PESP and PESQ) is composed of two bursts. The Q channel PES (PESQ) is derived from the magnitude of the B burst minus the magnitude of the A burst. Therefore, during the digitization of the A burst, the decoded values are all subtracted from the accumulated value. During the A burst, however, the values are all added to the accumulated value. The P channel PES (PESP) is derived from the magnitude of the D burst minus the magnitude of the C burst. Therefore, during the digitization of the C burst, the decoded digital values are successively subtracted from the accumulated value, while during the D burst, the values are successively added to the accumulated value. Whether the adder 125 adds or subtracts new values is governed by the ADD-/SUBTRACT control line 129.

The final digital PES value is equal to the running sum after both bursts have been completely digitized. The sum is reset to 0 before calculating the next cell (set of signal bursts). A RESET SUM line 131 controls resetting the latch 127 for the next cell.

The number of samples per burst (in the illustrated example, eight times the fundamental frequency), and the maximum unit of current (in the illustrated example 32), determine the precision of the digitization. The embodiment described allows for 10 bits of accuracy. To achieve better accuracy, either the sampling frequency of the system may be increased, or the maximum unit of current may be increased. Both of these approaches may require either more hardware or more expensive hardware.

Once both bursts of the particular channel (P or Q) have been digitized, and the running sum is determined, the output of the digital integrator may be loaded into a digital filter or other further digital signal processing device. Numerous different types of digital filters may be used, as may be appropriate for the signal environment.

Because the digitized PES channel performs the digitization of the PES for every servo cell, the sampling rate is high enough to permit effective digital filtering. Conventional analog-to-digital conversion techniques are typically much too slow to provide a digital signal on which appropriate digital filtering can be performed. Furthermore, traditional analog-to-digital converters are typically too complicated to be practical and cost effective in an extremely high speed environment such as the PES channel. Filtered PES values and unfiltered PES values can both be used by the servo system, as is known to those skilled in the art. The unfiltered values are used during seek operations when a large bandwidth is desirable. The filtered values may be used during track following, when a low bandwidth is desired, to reduce the effects of repeatable and non-repeatable noise.

The digital integration of the invention eliminates a large amount of analog hardware typically necessary in integrating the position error signal.

While a preferred embodiment of the present invention has been illustrated in detail, it should be apparent that modifications and adaptations to that embodiment may occur to one skilled in the art without departing from the scope of the invention as set forth in the following claims.

We claim:

1. A method of digitizing an input analog servo position error signal, the method comprising:
   (1) charging a charge storage device with said input analog signal;
   (2) comparing the voltage on said charge storage device with each of a plurality of voltage thresholds to produce a comparator output signal for each threshold exceeded by said charge storage device voltage, said comparing step further comprising comparing said charge storage device voltage with first through fifth thresholds, having threshold values of −1, 1, 4, 16, and 32 times a reference voltage, respectively;
   (3) sampling said comparator output signals to produce samples of said comparator output signals;
   (4) generating each sampling period a current corresponding to the highest voltage threshold exceeded;
   (5) applying said generated current to said charge storage device to draw of some of said capacitor voltage; and
   (6) repeating steps (1) and (5) until the highest threshold exceeded by said charge storage device voltage is the threshold representing an equilibrium voltage.

2. The method of claim 1, additionally comprising decoding said sampled comparator output signals.

3. The method of claim 2, additionally comprising summing said sampled comparator output signals over a predetermined time to integrate said comparator output signals.

4. The method of claim 1, additionally comprising equalizing DC bias current that may be received by said charge storage device, comprising:
   (a) squelching said input analog current;
   (b) allowing said charge storage device to be charged by any DC bias current;
   (c) comparing the voltage on said charge storage device with each of said plurality of thresholds to produce a comparator output signal for each threshold exceeded by said charge storage device voltage;
   (d) sampling said comparator output signals at a predetermined sampling rate to produce samples of said comparator output signals;
   (e) generating each sampling period a current corresponding to the highest threshold exceeded;
   (f) applying said generated current to said charge storage device to draw off or add to the charge caused by said DC bias current until the highest voltage threshold exceeded by said capacitor voltage is the threshold representing an equilibrium voltage.

5. The method of claim 1, wherein when the charge storage device voltage exceeds said first threshold but not said second threshold, said charge storage device is considered to be at an equilibrium voltage.

6. A method of digitizing an input analog demodulated servo position error signal, the method comprising:
   (1) charging a capacitor with said servo position error signal;
   (2) comparing the voltage on said capacitor with each of a plurality of voltage thresholds to produce a comparator output signal for each threshold exceeded by said capacitor voltage;
   (3) sampling said comparator output signals at a predetermined sampling rate;
   (4) generating each sampling period a current corresponding to the highest voltage threshold exceeded;
   (5) applying said generated current to said capacitor to draw off some of said capacitor voltage;
   (6) continuing steps (1) through (5) until the highest threshold exceeded by said capacitor voltage is the threshold representing an equilibrium voltage;
   (7) decoding said sampled comparator output signals; and (8) combining said decoded sampled comparator output signals over a predetermined time to generate a digital position error signal.

7. The method of claim 6 wherein said predetermined time over which said decoded sampled comparator output signals are combined is one cell of the position error signal.

8. The method of claim 7 wherein said step of combining said decoded sampled comparator output signals comprises:
   for a first predetermined time successively subtracting each digital sample from the previous combination of signals; and
   for a second predetermined time successively adding each digital sample to the previous combination of signals;
   at the end of said second predetermined time taking the combination value as the position error signal value; and
   resetting the combination value to zero.

9. An apparatus for digitizing an input analog servo position error signal, the apparatus comprising:
   a charge storage device for receiving and being charged by said input analog servo position error signal;
   a plurality of comparators, each electrically connected to said charge storage device for comparing the voltage of said charge storage device with a voltage threshold, each comparator producing a comparator output signal when the voltage of said charge storage device exceeds the threshold of that comparator;
   a latch connected to said comparators for sampling comparator output signals;
   a plurality of weighted current sources, each connected through said latch to a corresponding one of said comparators to generate each sampling period a current corresponding to the highest comparator threshold exceeded by the voltage on said charge storage device, and wherein said current sources are connected to said charge storage device to draw charge from said charge storage device.

10. The apparatus of claim 9, additionally comprising a decoder electrically connected to said comparators to decode said comparator output signals.

11. The apparatus of claim 10, additionally comprising an integrator connected to said sampling mechanism to integrate sampled comparator output signals over a predetermined time.

12. The apparatus of claim 10, additionally comprising a bias trim mechanism comprising:
   a counter connected to said decoder to produce a count proportional to the decoded comparator output signals;
   a digital to analog converter connected to said counter and to said charge storage device to convert counts produced by said counter to a current to supply to said charge storage device.

13. The apparatus of claim 12, wherein said digital to analog converter is connected to said charge storage device to apply a charge to said charge storage device to neutralize the charge sensed by said comparators to produce the decoded comparator output signals.

* * * * *